United States Patent [19]
Pasqualoni et al.

[11] Patent Number: 5,477,008
[45] Date of Patent: Dec. 19, 1995

[54] POLYMER PLUG FOR ELECTRONIC PACKAGES

[75] Inventors: Anthony M. Pasqualoni, Hamden; Deepak Mahulikar, Madison; Francis S. Jewell, Meriden, all of Conn.; Paul R. Hoffman, Modesto, Calif.; George Brathwaite, Hayward, Calif.; Richard McNabb, Manteca, Calif.; German Ramirez, Antioch, Calif.

[73] Assignee: Olin Corporation, New Haven, Conn.

[21] Appl. No.: 33,919

[22] Filed: Mar. 19, 1993

[51] Int. Cl.⁶ .................................................. H05U 5/06
[52] U.S. Cl. .................................... 174/52.3; 29/841
[58] Field of Search .................... 174/52.1, 52.2, 174/52.3, 52.4; 29/841, 855, 856; 257/787, 788, 793, 704; 437/207, 219

[56] References Cited

U.S. PATENT DOCUMENTS

| | | | |
|---|---|---|---|
| 3,739,330 | 6/1973 | Hazelhurst et al. | 174/52.3 |
| 3,943,623 | 3/1976 | Mizutani et al. | 437/217 |
| 4,105,861 | 8/1978 | Hascoe | 174/52.4 |
| 4,461,924 | 7/1984 | Butt | 29/827 X |
| 4,594,770 | 6/1986 | Butt | 437/219 |
| 4,675,987 | 6/1987 | Minus et al. | 29/400.1 |
| 4,780,572 | 10/1988 | Kondo et al. | 174/52.4 |
| 4,801,998 | 1/1989 | Okuaki | 257/681 |
| 4,816,426 | 3/1989 | Bridges et al. | 437/207 |
| 4,897,508 | 1/1990 | Mahulikar et al. | 174/52.4 |
| 4,939,316 | 7/1990 | Mahulikar et al. | 29/827 X |
| 5,013,871 | 5/1991 | Mahulikar et al. | 174/52.4 |
| 5,037,779 | 8/1991 | Whalley et al. | 437/211 |
| 5,066,368 | 11/1991 | Pasqualoni et al. | 205/112 |
| 5,117,279 | 5/1992 | Karpman | 257/793 |
| 5,218,234 | 6/1993 | Thompson et al. | 257/787 |
| 5,229,549 | 7/1993 | Yamakawa et al. | 174/262 |
| 5,261,157 | 11/1993 | Chang | 29/844 |

Primary Examiner—Leo P. Picard
Assistant Examiner—Christopher Horgan
Attorney, Agent, or Firm—Gregory S. Rosenblatt

[57] ABSTRACT

There are provided polymer plugs for sealing the vent hole of an adhesively sealed electronic package. The polymer vent hole plug is selected to be either an ultraviolet curable polymer or a thermosetting polymer resin. One effective vent hole plug is a cylindrical plug having a diameter under 1.4 millimeters formed from a UV-curable epoxy.

10 Claims, 3 Drawing Sheets

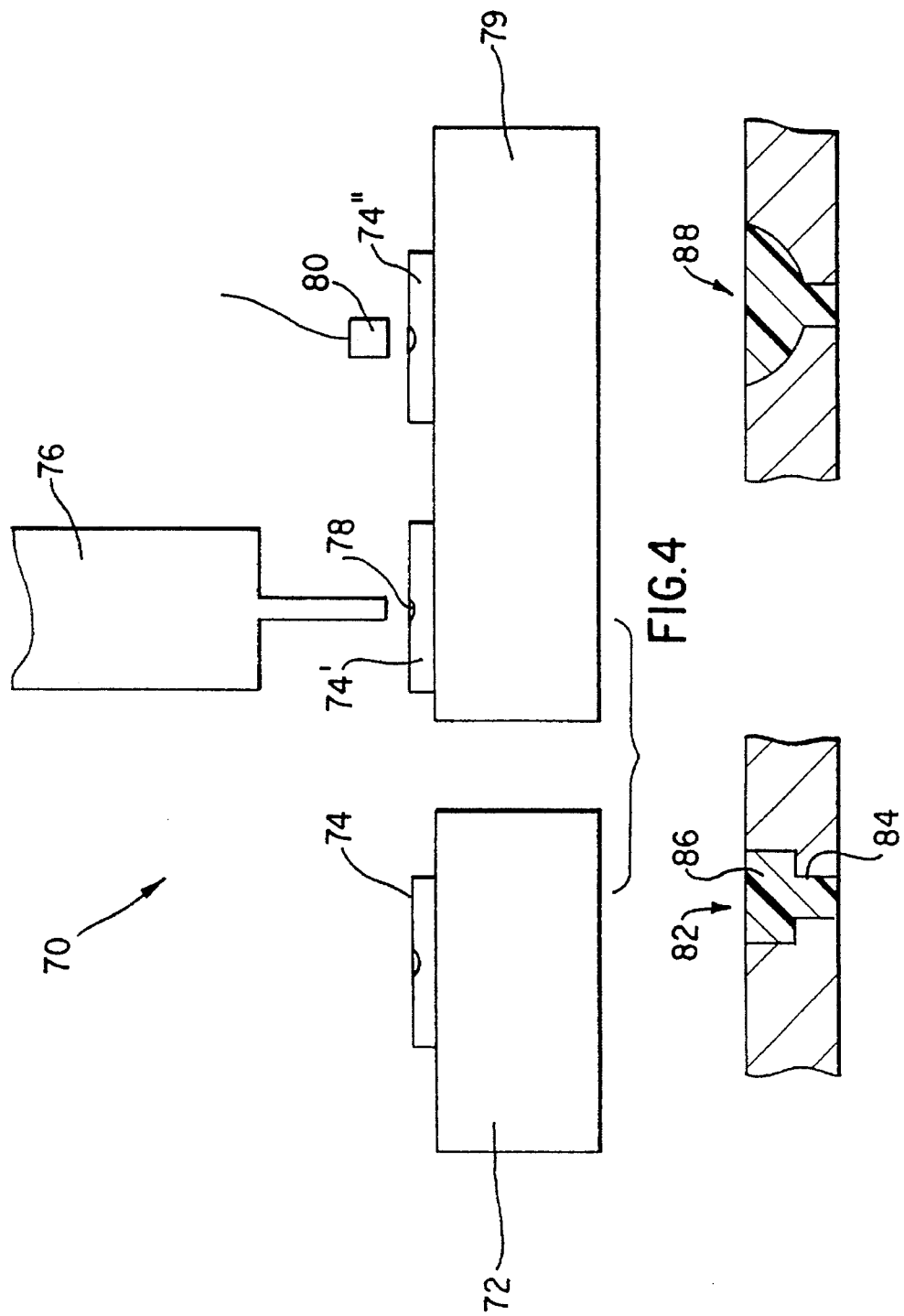

POLYMER PLUG FOR ELECTRONIC PACKAGES

BACKGROUND OF THE INVENTION

This invention relates to adhesively sealed electronic packages for encapsulating integrated circuit devices. More particularly, the invention relates to a polymer plug for sealing a vent hole.

Electronic packages provide mechanical and environmental protection for integrated circuit devices such as silicon based semiconductor circuits. The electronic package also provides a means for electrical signals to travel between the encapsulated device and external circuitry.

One electronic package includes separate base and cover components defining a cavity. An integrated circuit device is housed within the cavity and a leadframe disposed between and bonded to both the base and the cover. The inner lead portions of the leadframe are within the cavity and the outer lead portions extend beyond the perimeter of the package. Small diameter wires electrically interconnect the inner leads to input/output pads on an electrically active face of the integrated circuit device. The outer leads are then electrically connected to a printed circuit board or other external circuit.

The base and cover are bonded together with a dielectric such as a low temperature sealing glass or a polymer adhesive. One common sealant is an epoxy sheet preform as disclosed in U.S. Pat. Nos. 4,105,861 to Hascoe, 4,594,770 to Butt, and 4,939,316 to Mahulikar. The base and cover components may be any suitable material such as a polymer, ceramic or metal. High thermal conductivity metals such as copper and aluminum are favored. These metals facilitate the removal of heat from the encased semiconductor device. Aluminum alloys provide the additional benefits of being lightweight and are capable of having a dielectric coating formed by anodization as disclosed in U.S. Pat. No. 4,939,316, which is incorporated by reference herein.

A preferred means for sealing the base and cover is a thermosetting polymer such as an epoxy. When the epoxy cures, ionic contaminants such as chlorides ($Cl^-$) are generated. The ionic contaminants deposit on the thin bond wires and the electrically active face of the semiconductor device. In the presence of moisture, the ionic contaminants form dilute acids such as HCl, which corrode package components.

To avoid the accumulation of ionic contamination, a vent hole is disclosed in U.S. Pat. Nos. 4,897,508 and 5,013,871, both to Mahulikar and both incorporated by reference herein. The vent hole allows both ionic contaminants and water vapor to escape the package cavity during cure. The vent hole is subsequently sealed by epoxy bonding a countersunk metallic plug over the vent hole.

A metallic plug to seal the vent hole is satisfactory when a package has an overall thickness in the range of 3–4 millimeters (0.118–0.157 inch). The current trend is to thinner packages, on the order of less than 2 mm (0.078 in.) thick. These packages are lighter and take up less space than conventional packages. Both weight and real estate are important considerations in commercial, aerospace and military applications. Also, with a thinner package, the integrated circuit device is closer to a printed circuit board or external heat sink, enhancing the dissipation of heat from the device.

One way to form thinner packages is by reducing the thickness of the epoxy seal. Epoxy preforms are described in U.S. Pat. No. 5,013,871 as window frame shaped structures stamped from an epoxy sheet. To facilitate handling, the sheet generally has a thickness of about 0.38 mm (0.015 in.). Two preforms are utilized, one between the base and the leadframe, the other between the leadframe and the cover. The two epoxy sheets contribute 0.76 mm (0.30 in.) to package thickness. Replacing the preform sheets with a dispensed liquid adhesive as disclosed in U.S. patent application Ser. No. 07/987,867 to Liang, filed Dec. 9, 1992, and incorporated by reference herein, can reduce the total epoxy thickness to about 0.1 mm (0.004 in.).

Another way to reduce the thickness of the electronic package is to reduce the thickness of the base and cover components. For example, it is proposed to reduce the thickness of the cover component from 0.635 mm (0.025 in.) to 0.25 mm (0.010 in.). Since a vent hole is still required, this process is not amenable to the current practice of adhesively bonding a metallic plug over a countersunk vent hole. The metallic plug would be extremely thin, prone to bending, and difficult to handle. Further more, because of the thinness of the cover, a countersunk vent hole can not be reliably formed by stamping or machining.

The present invention is therefore drawn to a vent hole plug which does not have the disadvantages of the prior art and is amenable to use in a thin package.

SUMMARY OF THE INVENTION

Accordingly, it is an object of the invention to provide a polymer plug to seal the vent hole of an electronic package. It is a feature of the invention that either quick cure epoxies or ultraviolet (UV) light curable acrylics or epoxies may be utilized as the plug. Yet another feature of the invention is that when the vent hole is below a specified diameter, the polymer plug does not reduce the reliability of the package. It is an advantage of the invention that the polymer plug is particularly suited to thin electronic packages and avoids the problems of stamping and aligning thin metallic vent plugs. The cure cycle of the quick cure epoxy and UV epoxy requires reduced time at elevated temperature. Thermal degradation of the device is therefore reduced.

In accordance with the invention, there is provided an adhesively sealed electronic package. The package includes a base component and a cover component which in combination define a cavity. A leadframe is disposed between the base and the cover and adhesively bonded to both. A polymer vent hole with a diameter less than about 1.4 mm (0.055 in.) extends through at least one of the base or the cover.

The above stated objects, features and advantages will become more apparent from the specification and drawings which follow.

BRIEF DESCRIPTION OF THE DRAWINGS

FIG. 4 illustrates in schematic, a method for sealing a vent hole in accordance with the invention.

FIG. 5 illustrates in cross-sectional representation a compound vent hole in accordance with another embodiment of the invention.

FIG. 6 illustrates in cross-sectional representation a radiused vent hole in accordance with an embodiment of the invention.

DETAILED DESCRIPTION

Figure 1:
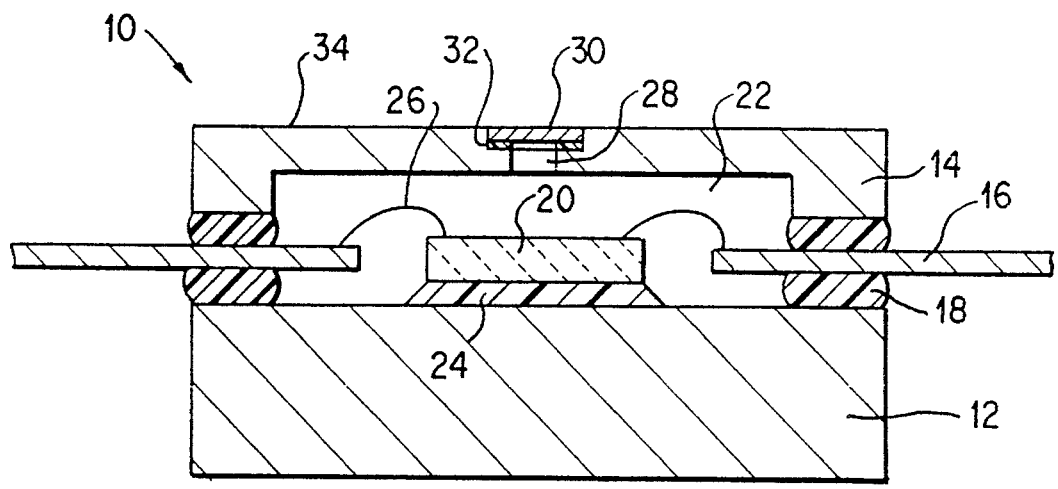
FIG. 1 illustrates in cross-sectional representation an adhesively sealed metal electronic package as known from the prior art.

FIG. 1 illustrates in cross-sectional representation an adhesively sealed metal electronic package 10 as known from the prior art. The package includes a metallic base component 12 and a metallic cover component 14. A leadframe 16 is disposed between the base component 12 and cover component 14 and bonded to both by an epoxy adhesive 18. A semiconductor device 20 is disposed within the cavity 22 defined by the base component 12 and cover component 14. A die attach 24 bonds the semiconductor device 20 to either the package base 12 or to a centrally positioned die attach paddle (not shown). Small diameter, on the order of 0.025 mm (0.001 in.), bond wires 26, formed from aluminum, gold, copper or their alloys, electrically interconnect the semiconductor device 20 to the leadframe 16.

The epoxy adhesive 18 is cured by heating the package to a temperature of about 180° C. for about 3.5 hours. As the epoxy polymerizes, ionic contaminants and water vapor are discharged. The ionic contaminants must be removed from the package cavity 22 to prevent corrosion. The water vapor must be removed to prevent voids or blow holes in the epoxy adhesive 18. Egress of the ionic contaminants and water vapor is through the vent hole 28. Once the package is bonded, a metallic plug 30 typically formed from the same material as the cover component 14 is inserted in a countersunk oversized portion of the vent hole 28. An epoxy sheet preform 32 then bonds the vent hole plug 30 to the countersunk region of the vent hole 28. A typical cure cycle for a thermosetting epoxy adhesive is 125° C. for 2 hours.

The vent plug 30 after sealing, must lie flush with a top surface 34 of the electronic package 10 and must further be similar in appearance to the top surface 34. The uniformity of appearance is required both for cosmetic reasons and thermal reasons. Infrared radiation of heat is enhanced when the package has a uniform grey to black color as achieved by integral color anodization of an aluminum designated as in the 3XXX series by the American Society for Metals (ASM). Alloys of the 3XXX series contain up to about 1.5% by weight manganese, along with other alloying elements as further disclosed in U.S. Pat. No. 5,066,368 to Pasqualoni.

Manufacture of the vent hole plug 30 is difficult because the flatness must be retained during stamping and handling to ensure sealing of the vent hole 28. The thickness of the vent hole plug 30 is limited to from about one third to about one half the thickness of the cover component 14 by the requirements that the top surface of the vent hole be flush with the top surface 34, that a vent hole adhesive 32 is required, and that the cover component 14 must include sufficient metal around the vent hole 28 that the package lid does not distort during the epoxy 18 cure. The cover, including the countersunk vent hole, must be capable or stamping or machining. These requirements are met in conventional thickness packages having an overall lid thickness of about 0.64 mm. An alternative solution is required for a thin electronic package when the overall lid thickness is on the order of 0.25 mm (0.10 in.).

Figure 2:
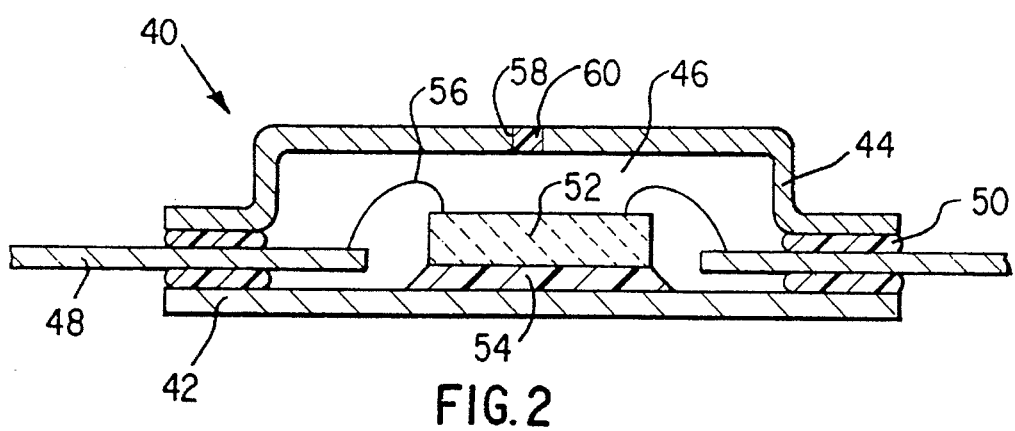
FIG. 2 illustrates in cross-sectional representation an adhesively sealed metal package having reduced thickness and a polymer vent hole in accordance with the present invention.

FIG. 2 illustrates in cross-sectional representation a thin electronic package 40 utilizing the vent hole plug of the invention. The thin electronic package 40 has a base component 42 and a cover component 44. The combination of the base component 42 and cover component 44 define a cavity 46. A leadframe 48 is disposed between the base component 42 and cover component 44 and adhesively bonded to both. To minimize the package thickness, the adhesive 50 utilized to assemble the package is a dispensed liquid epoxy such as E9459, manufactured by the Hysol Division of the Dexter Company (Pittsburg, Calif). This epoxy is cured by heating to 175° C.–225° C. for from 1 to 10 minutes. The thickness of each epoxy layer is on the order of 0.051 mm (0.002 in.). A semiconductor device 52 is bonded to the base component 42 by a die attach 54. Suitable die attach materials include soft solders such as alloys of lead and tin, and gold based eutectic solders such as alloys of gold and tin. Other suitable die attach materials include sealing glasses and thermosetting epoxies. The sealing glass or thermosetting epoxy may be filled with an electrically and/or thermally conductive material such as a silver powder. The semiconductor device 52 may also be mounted on a die attach paddle (not shown) formed from the same material as the leadframe 48 which is then bonded to the base component 42, by materials similar to those utilized for die attach. Wire bonds 56 electrically interconnect the leadframe 48 to the semiconductor device 52.

The base component 42 and cover component 44 may be formed from any suitable material such as a ceramic, polymer or metal. Exemplary ceramics include alumina ($Al_2O_3$), aluminum nitride (AlN) and beryllium oxide (BeO). Any plastic which remains rigid at the epoxy cure temperature (under about 225° C.) is suitable. Such plastics include thermosetting epoxies and polyethersulfone.

In a preferred embodiment, the package base 42 is formed from a metal such as copper, aluminum or alloys thereof. Metals have the advantage of ease of proccessability and excellent thermal conductivity. A preferred metal is aluminum of the 3XXX or 6XXX (aluminum alloys containing magnesium and silicon) series. One most preferred metal is aluminum alloy 3003 (nominal composition by weight 0.05–0.20% copper, 1.0–1.5% manganese and the balance aluminum). A second most preferred metal is aluminum alloy 6061 (nominal composition by weight 0.40–0.80% silicon, 0.15–0.40% copper, 0.8–1.2% magnesium, 0.04–0.35% chromium and the balance aluminum).

The cover component 44 is formed from a material having a coefficient of thermal expansion within about 10% of that of the base component 42 to prevent thermally induced flexure of the package during assembly or operation. While typically, the cover component 44 is formed from the same material as the base component 42, combinations of materials may be utilized to enhance package performance. For example, the cover component 44 may be a ceramic or metal-ceramic composite to introduce stiffness to the electronic package while the base component is metal to maximize thermal dissipation. If the cover component 44 is a metal, it is preferably coated with a dielectric material to prevent electrical short circuiting of the bond wires 56. When the cover 44 is aluminum, an anodization layer forms such a suitable dielectric layer. In most preferred embodiments of the invention, the cover component 44 is also formed from aluminum alloy 3003 or 6061.

A vent hole 58 is formed in at least one of the base component 42 or cover component 44 to permit the egress of ionic contaminants and water vapor during the cure of the epoxy 50. The vent hole 58 is then sealed with a polymer vent hole plug 60.

The vent hole plug 60 has a color approximately matching that of the cover component 44, typically grey to black to enhance thermal dissipation. The polymer vent hole plug 60 is also selected to be a polymer which is self leveling to form a uniform top cover surface. Other considerations are the vent hole plug must be able to withstand various environmental tests such as thermal cycling and pressure cooker exposure.

Certain polymer vent hole plugs develop bubbles during cure. These bubbles, which weaken the plug and result in failures on thermal cycling, are most prevalent in UV acrylics. One method to reduce the formation of bubbles is to restrict the diameter of the vent hole 58. Vent holes having a diameter below about 1.4 mm (0.055 in.), and preferably in the range of from about 0.38 mm to about 0.64 mm (0.015–0.25 in.) eliminate or minimize bubble formation during cure of the polymer vent hole plug 60.

When the vent hole plug is formed from a thermosetting epoxy, preheating the electronic package 40 to a temperature in the range of 170° C.–205° C. prior to dispensing the polymer will also reduce the formation of bubbles during the adhesive cure.

Figure 3:
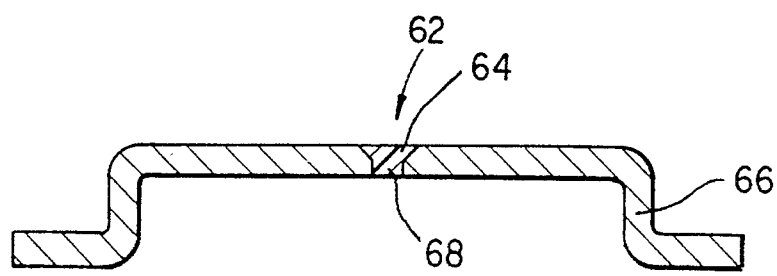
FIG. 3 illustrates in cross-sectional representation a conical vent hole in accordance with an embodiment of the invention.

A second consideration in maintaining vent hole plug integrity is minimization of mechanical stresses caused by coefficient of thermal expansion mismatch between the vent hole plug polymer and the cover of the package. A conical vent hole plug 62 as illustrated in FIG. 3 provides optimal stress minimization. The diameter on an outward facing surface 64 of the cover component 66 is greater than the diameter on a cavity facing surface 68. Preferably, the diameter on the outward facing surface 64 is on the order of two times the diameter of the cavity facing surface 68.

The polymer vent plug is preferably formed from an ultraviolet (UV) curable polymer or a thermosetting polymer resin having a relatively short cure cycle. UV curable adhesives include acrylics and epoxies which crosslink upon exposure to ultraviolet light such as manufactured by Loctite (Newington, CT), Dymax (Torrington, Conn) and Electro-Lite (Danbury, Conn). The UV curable polymers have a room temperature viscosity of from about 500 to about 10,000 centipoise and preferably from about 1000 to about 4000 centipoise.

The process of sealing the vent hole is dependent on the type of polymer utilized as the vent hole plug. For a UV curable epoxy such as Electro-Lite #2500 UV Epoxy, a volume of the UV curable adhesive sufficient to fill the vent hole is dispensed into the vent hole such as by a metered syringe. The syringe may be heated to improve the flow of the adhesive. For the UV curable epoxy, a syringe temperature of from about 25° C. to about 35° C. is preferred. The UV adhesive is exposed to a UV source by a spot source placed close, typically from about 0.8 mm to about 6.35 mm (1/32 to 1/4 in.) to the adhesive.

A suitable UV intensity is from about 50 to about 400 milliwatts per square centimeter, and preferably from about 150 to about 250 mW/cm$^2$ Higher intensities may cause the adhesive to unduly generate heat leading to blow holes and voids. A suitable UV exposure time is from about 10 seconds to about 2 minutes. The cross-linking initiated by the UV exposure can be accelerated by a post-UV exposure thermal treatment comprising heating the package to from about 20° C. to about 30° C. for from about 10 to about 30 minutes.

The quick cure thermosetting adhesives are generally epoxies of the type referred to as snap cure. One such adhesive is "EA9432NA" (trademark of the Hysol Division of Dexter Corporation). The snap cure epoxies have a room temperature viscosity of from about 5000 centipoise to about 3000 poise and preferably from about 40,000 centipoise to about 80,000 centipoise.

A polymer vent hole plug formed from a snap cured adhesive is processed according to the following steps. The electronic package is preheated, such as on a moving stage or a hot plate, to a temperature of from about 170° C. to about 205° C., preferably 190° C.–205° C., and allowed to dwell at that temperature for from about 2 to about 10 minutes to equilibrate. The preheat temperature should not exceed the temperature at which the adhesive used to join the package base and cover begins to thermally degrade. For the EA9459 epoxy disclosed above, this temperature is about 210° C.. The epoxy is dispensed into the vent hole such as by a metered syringe. Preferably, a temperature controlling jacket is disposed around the syringe so that the epoxy is at a temperature of approximately 25° C.–35° C.. The package is then retained at a temperature slightly lower than the preheat temperature for a time effective to substantially complete polymerization. This post-dispense cure time is typically from about 10 seconds to about 3 minutes and preferably in the range of 15 seconds to 1 minute. The package is then slowly cooled to room temperature. The post-dispensed cure temperature should be from about 3° C. to about 10° C. less than the preheat temperature. If the temperature differential is less than about 3° C., then the epoxy may polymerize too quickly and develop bubbles or voids. A temperature differential larger than about 10° C. may cause the epoxy to polymerize too slowly. Vent hole polymer may drip into the package cavity.

FIG. 4 illustrates schematically, an apparatus 70 for the sealing of the vent hole plug of an adhesively sealed electronic package. The first stage is a preheater 72. For UV curable vent hole plugs, the package 74 is heated to a temperature of about 25° C. to about 35° C.. For snap cure thermosetting epoxies, the package is heated to a maximum temperature which does not induce thermal degradation of the package seals. Typically, this temperature is about 210° C..

The second stage of the process is the dispensing of the polymer. A metered syringe 76 which is preferably temperature controlled, deposits a controlled amount 78 of polymer into the vent hole of a package 74'. Preferably, the syringe heats the adhesive, either UV curable or thermosetting to a temperature of from about 25° C. to about 35° C..

The third stage 79 of the process is the adhesive cure. If the adhesive is UV curable, a UV source 80 initiates cross linking. Subsequent to UV irradiation, the package 74" may be heated to accelerate cross-linking. A typical temperature is about 25° C. for about 20 minutes.

If the adhesive is a thermosetting resin, the UV source is omitted. Cure is initiated by maintaining the package 74" at elevated temperature. The temperature of the third stage 79, is slightly less than the temperature of the first stage, generally from about 3° C. to about 10° C. less.

FIG. 5 illustrates in cross-sectional representation a composite vent plug 82. The vent plug 70 includes a small diameter interior portion 84 and a relatively larger diameter exterior region 86. The interior portion has a diameter of from about 0.38 mm to about 0.76 mm. A polymer vent hole plug formed from a UV curable adhesive is formed in the interior portion 84. After the UV adhesive cures, a liquid epoxy is dispensed in the larger diameter exterior portion 86. This liquid epoxy is selected to have a relatively low viscosity at room temperature and to be self leveling. The UV adhesive plug 84 prevents the low viscosity thermosetting resin from dripping into the package cavity and removes the necessity of a quick epoxy cure. The thermosetting epoxy may be placed in an oven and cured over an extended period of time, typically on the order of 2–4 hours. One suitable material is a thermosetting epoxy such as Hysol EA9459.

The advantages of the polymer vent hole plugs of the invention will become more apparent from the example which follow. The examples are intended to be exemplary and not to limit the scope of the invention.

EXAMPLE 1

Adhesively sealed metal electronic packages having anodized aluminum covers and vent holes with a diameter of from about 0.51 millimeter to about 1.0 millimeter (0.02–0.4 inch) were sealed with a drop of Electro-Lite ELC-2500 UV curable acrylic. The packages were then subjected to accelerated testing and the integrity of the vent hole plug evaluated by immersion in an inert fluorocarbon liquid (FC-40, manufactured by 3M Corporation of Minneapolis, Minn). A stream of bubbles emanating from the vent hole indicated the integrity of the seal had been compromised and constituted a failure. The absence of a stream of bubbles constituted a pass.

| | |
|---|---|
| Pressure cooker | The packages were exposed to 100% relative humidity and 121° C. at a pressure of 70.31 gm/cm$^2$ (pressure of 1 pound per square inch gauge (psig)) for 300 hours. 16 tested/16 passed. |
| Thermal shock | The parts were sequentially immersed in a first (−65° C.) and a second (150° C.) inert fluorocarbon liquid. Each immersion was for 5 minutes. The cycle was repeated 1000 times. 20 tested/20 passed. |
| High temperature storage | The parts were stored in dry heat at 150° C. for 1100 hours. 20 tested/20 passed. |
| Vapor phase | The packages were cooled to 0° C. and then surrounded by a first inert fluorocarbon vapor at 200° C. for 30 seconds and then a second inert fluorocarbon vapor at 240° C. for 45 seconds. The cycle was repeated 10 times. 6 tested/6 passed. |
| Temperature cycling | The packages were advanced through a three stage heating cycle, with temperature stages progressing from 25° C. to 150° C. to 25° C. to −65° C. back to 25° C.. The time to progress from one step in the cycle to the next was 10 minutes and the time at each step was up to 5 minutes. The cycle was repeated 1500 times. 20 tested/20 passed. |

EXAMPLE 2

A snap cure adhesive, Hysol EA9432NA, was dispensed into vent holes formed in adhesively sealed metal electronic packages having an anodized aluminum cover. The packages were then subjected to environmental testing and the integrity of the vent plug evaluated by gross leak testing.

| | |
|---|---|
| Pressure cooker | The packages were exposed to 100% relative humidity and 121° C. at a pressure of 70.31 gm/cm$^2$ (1 psig) for both 200 hours and 500 hours. 20 tested/20 passed after both 200 and 500 hour dwells. |
| Thermal shock | The packages were sequentially immersed in a first (−65° C.) and a second (150° C.) inert fluorocarbon liquids. Each immersion was for 30 seconds. The cycle was repeated 100 times. 20 tested/20 passed. |
| Vapor phase | The packages were cooled to 0° C. and then surrounded by a first inert fluorocarbon vapor at 200° C. for 30 seconds and then a second inert fluorocarbon vapor at 240° C. for 45 seconds. The cycle was repeated 10 times. 12 tested/12 passed. |
| High temperature storage | The parts were stored in dry heat at 150° C. for 1100 hours. 20 tested/20 passed. |
| Temperature cycling | The packages were advanced through a three stage heating cycle, with temperature stages progressing from 25° C. to 150° C. to 25° C. to −65° C. back to 25° C.. The time to progress from one step in the cycle to the next was 10 minutes and the time at each step was up to 5 minutes. The cycle was repeated 1000 times. 51 tested/51 passed. |

EXAMPLE 3

The stresses generated within various shaped vent hole plugs during thermal cycling (−65° C. to 150° C., dwell time until equilibration of the package) were calculated by finite element modeling. The lowest stresses were generated in a conical vent hole plug as illustrated in FIG. 3. The maximum stresses were in a conventional shaped vent hole plug as illustrated in FIG. 5. A radiused (bowl shaped) vent hole 88, as illustrated in FIG. 6, had an intermediate amount of generated stresses.

| | Generated Stress | |
|---|---|---|
| Shape | (Mpa) | (ksi) |
| Conical | 18.69 | 2710 |
| Bowl | 27.02 | 3920 |
| Standard | 48.06 | 6970 |

Figure 7:
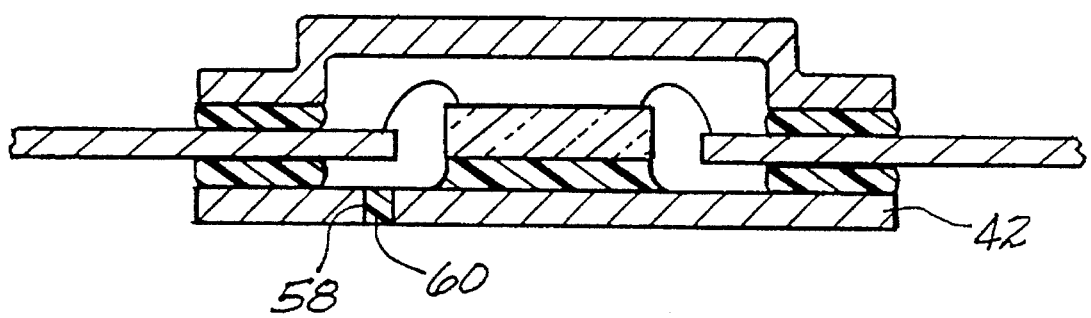
FIG. 7 illustrates in cross-sectional representation a conical vent hole in accordance with yet another embodiment of the invention.

While the vent holes and vent hole plugs of the invention have been particularly described in combination with an electronic package cover, it is equally suitable for the vent hole 58 and vent hole plug 60 to be formed in a package base 42 as illustrated in cross-sectional representation in FIG. 7.

The patents and patent application disclosed in this specification are intended to be incorporated herein by reference.

It is apparent that there has been provided in accordance with this invention a polymer vent hole plug which fully satisfies the objects, features and advantages set forth herein above. While the invention has been described in combination with specific embodiments, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An adhesively sealed electronic package, comprising:

a base component;

a cover component, the combination of said base component and said cover component defining a cavity;

a leadframe disposed between said base component and said cover component and adhesively bonded to both; and a polymer vent hole plug selected from the group consisting of ultraviolet curable polymers having a room temperature viscosity before curing of from about 500 centipoise to about 10,000 centipoise and thermosetting epoxy resins having a room temperature viscosity before curing of from about 5,000 centipoise to about 3000 poise and a cure time of under 3 minutes, said polymer vent hole plug having a diameter of less than about 1.4 millimeters and extending through at least one of either said base component or said cover component.

2. The electronic package of claim 1 wherein said base component and said cover component are individually selected from the group consisting of metals, plastics and ceramics with the coefficient of thermal expansion of said base component being within about 10% of the coefficient of thermal expansion of said cover component.

3. The electronic package of claim 2 wherein said thermosetting epoxy has a room temperature viscosity before cure of from about of from about 40,000 centipoise to about 80,000 centipoise.

4. The electronic package of claim 2 wherein both said base component and said cover component are formed from an aluminum alloy and at least partially coated with an anodization layer.

5. The electronic package of claim 2 wherein said vent hole plug has a diameter of from about 0.38 millimeter to about 0.64 millimeter.

6. The electronic package of claim 2 wherein said vent hole plug is conical with the diameter at the cavity facing surface less than the diameter of the outward facing surface.

7. The electronic package of claim 6 wherein the diameter of said conical vent hole plug is from about 0.38 millimeter to about 0.64 millimeter at the cavity facing surface and from about 0.76 millimeter to about 1.28 millimeters at the outward facing surface.

8. An adhesively sealed electronic package, comprising:

a base component;

a cover component, the combination of said base component and said cover component defining a cavity;

a leadframe disposed between said base component and said cover component and adhesively bonded to both; and a composite polymer vent hole plug extending through at least one of either said base component or said cover component and having a smaller diameter interior portion formed from a UV-curable adhesive within said component and a larger diameter exterior portion formed from a thermosetting epoxy also within said component.

9. The electronic package of claim 8 wherein an interior portion of said vent hole plug has a diameter of from about 0.38 millimeter to abound 0.76 millimeter and the exterior portion of said vent hole plug has a larger diameter.

10. The electronic package of claim 8 wherein said thermosetting epoxy resin is self leveling.

\* \* \* \* \*